(12) United States Patent
Wuerstlein et al.

(10) Patent No.: US 9,585,280 B2
(45) Date of Patent: Feb. 28, 2017

(54) ELECTRONIC MODULAR UNIT, IN PARTICULAR CAPACITIVE PROXIMITY SENSOR FOR A VEHICLE AND METHOD OF PRODUCING THE MODULAR UNIT

(71) Applicant: BROSE FAHRZEUGTEILE GMBH & CO. KOMMANDITGESELLSCHAFT, HALLSTADT, Hallstadt (DE)

(72) Inventors: Holger Wuerstlein, Zeil am Main (DE); Thomas Weingaertner, Memmelsdorf (DE); Christian Weidenbacher, Donnersdorf (DE); Holger Schmitt, Adelsdorf (DE); Thorsten Kuhnen, Litzendorf (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 0 days.

(21) Appl. No.: 14/832,070

(22) Filed: Aug. 21, 2015

(65) Prior Publication Data
US 2016/0057882 A1 Feb. 25, 2016

(30) Foreign Application Priority Data
Aug. 21, 2014 (DE) .................. 10 2014 012 652

(51) Int. Cl.
*H05K 5/00* (2006.01)
*H05K 7/14* (2006.01)
(Continued)

(52) U.S. Cl.
CPC ......... *H05K 7/1427* (2013.01); *G01R 27/2605* (2013.01); *H01R 12/59* (2013.01); *H01R 43/0263* (2013.01); *H01R 43/205* (2013.01); *H05K 1/11* (2013.01); *H05K 3/3405* (2013.01); *H05K 5/0069* (2013.01); *H05K 13/0023* (2013.01); *H01R 12/57* (2013.01);
(Continued)

(58) Field of Classification Search
CPC .......... H05K 7/142; G06F 1/184; G06F 1/181; H01L 222/48091; H01L 2924/19041
USPC ................ 361/728–732, 752, 796
See application file for complete search history.

(56) References Cited

U.S. PATENT DOCUMENTS 5,777,855 A * 7/1998 Yokajty .................. H01R 12/62
361/749
6,178,318 B1 * 1/2001 Holmberg .............. H05K 9/003
174/358
(Continued)

FOREIGN PATENT DOCUMENTS

DE 102010049400 A1 4/2012

*Primary Examiner* — Hung S Bui
(74) *Attorney, Agent, or Firm* — Laurence A. Greenberg; Werner H. Stemer; Rolph E. Locher (57) ABSTRACT

An electronic modular unit having electronics has a printed circuit board, a housing receiving the electronics and an electrical conductor. The conductor is in this connection directly soldered with a flat connection end to a contact surface of the printed circuit board. In order to simplify the soldering process, a spring element is arranged in the housing and presses the connection end of the conductor on the contact surface of the printed circuit board for the purpose of fixing the connection end during soldering. The modular unit is, in particular, a capacitive proximity sensor for a vehicle.

10 Claims, 3 Drawing Sheets

(51) Int. Cl.
*G01R 27/26* (2006.01)
*H01R 12/59* (2011.01)
*H01R 43/20* (2006.01)
*H05K 1/11* (2006.01)
*H05K 13/00* (2006.01)
*H01R 43/02* (2006.01)
*H05K 3/34* (2006.01)
*H01R 12/57* (2011.01)

(52) U.S. Cl.
CPC ... *H05K 3/3494* (2013.01); *H05K 2201/1034* (2013.01); *H05K 2201/10151* (2013.01); *H05K 2201/10416* (2013.01); *H05K 2203/0195* (2013.01)

(56) References Cited

U.S. PATENT DOCUMENTS

| | | | |
|---|---|---|---|
| 8,319,118 B2* | 11/2012 | Edwards | H05K 9/0058 174/377 |
| 2005/0242161 A1* | 11/2005 | Shi | B23K 1/0056 228/180.21 |
| 2013/0201620 A1* | 8/2013 | Schlaupitz | H01R 12/57 361/679.27 |
| 2013/0234828 A1 | 9/2013 | Holzberg et al. | |

* cited by examiner

ELECTRONIC MODULAR UNIT, IN PARTICULAR CAPACITIVE PROXIMITY SENSOR FOR A VEHICLE AND METHOD OF PRODUCING THE MODULAR UNIT

CROSS-REFERENCE TO RELATED APPLICATION

This application claims the priority, under 35 U.S.C. §119, of German application DE 10 2014 012 652.8, filed Aug. 21, 2014; the prior application is herewith incorporated by reference in its entirety.

BACKGROUND OF THE INVENTION

Field of the Invention

The invention relates to an electronic modular unit having electronics containing a printed circuit board and a conductor which is brought into contact with the electronics and which is provided with a flat connection end. The modular unit is, in particular, a capacitive proximity sensor for a (motor) vehicle, wherein the conductor is used as sensor electrode of the capacitive proximity sensor. The invention also relates to a method for producing the modular unit, in particular for bringing the conductor into electrical contact with the printed circuit board.

Modern vehicles are often equipped with sensors which enable touch-free displacement of vehicle parts. By way of example, it is made possible for a vehicle user to actuate (that is to say open and/or close) a vehicle door in a touch-free manner, for example by use of a hand or foot motion owing to such a sensor. Such a touch-free tailgate switch is known, for example, from published, non-prosecuted German patent application DE 10 2010 049 400 A1, corresponding to U.S. patent publication No. 2013/0234828.

Capacitively acting proximity sensors are often used as sensors for detecting an actuation command. A capacitive proximity sensor of this type usually contains a sensor electrode or a plurality of sensor electrodes and a control unit.

The control unit usually contains electronics received in housing. The electronics are generally formed by a printed circuit board on which a microcontroller and/or other electronic components are mounted.

Flat conductors are often used as sensor electrodes, which flat conductors have a flat, strip-like conductor track with insulation surrounding this. Flat-conductor electrodes such as this are generally connected to the control unit via electrical supply lines in the form of conventional wire or stranded conductors. In this connection, the supply lines are often connected via plug-in or solder connections to the flat-conductor electrode on one side and the electronics unit on the other side. The supply lines are often soldered on one side to the assigned flat-conductor electrode and brought into contact on the other side with the electronics unit by a plug-in connection (ZIF plug) formed on the housing of the control unit.

SUMMARY OF THE INVENTION

The problem addressed by the invention is to enable efficient production of a modular unit of the type mentioned above and, in this connection, in particular, to implement the contact-making of a conductor provided with a flat connection end and the electronics in a simple but nevertheless functionally secure manner.

With reference to an electronic modular unit, in particular a capacitive proximity sensor, the problem is solved according to the invention by the features of the main claims. Advantageous embodiments and developments of the invention which are partly inventive per se are set out in the dependent claims and in the following description.

The electronic modular unit contains electronics having a printed circuit board, an (electronics) housing receiving the electronics and an electrical conductor, which is provided with a flat connection end. The conductor is soldered directly (that is to say without the conventionally intermediately connected supply line of a wire or stranded conductor) at the flat connection end to a contact surface of the printed circuit board. In this connection, according to the invention, a spring element is arranged in the housing and presses the connection end, which is guided into the housing, of the conductor—which is otherwise arranged outside of the housing—on the contact surface of the printed circuit board for the purpose of fixing the connection end during soldering.

The electrical conductor with which contact is to be made is preferably a flat conductor which has a flat, strip-like conductor track over its entire length. In principle, the conductor may have any desirable conductor cross section far away from the connection end within the scope of the invention, however. The conductor must have a flat conductor cross section only in the region of the connection end. In particular, the conductor may be formed in this sense by a coaxial cable (or a corresponding cylindrical sheath-shaped conductor without a coaxial inner conductor) which is pressed flat in order to form the connection end in an end region. Preferably, the conductor contains (electrical) insulation which surrounds the actual conductor track of the conductor.

"Spring element" in this case generally refers to a component which is at least partially elastically deformable and which is configured such that it exerts a spring force on the connection end in the correctly assembled state of the modular unit.

In the course of the preferred manufacturing method, the printed circuit board is already provided with a solder deposit (solder pad) in the region of the contact surface before insertion into the housing. For this purpose, in particular, a sufficient amount of solder for the soldering process is melted onto the contact surface and hence connected to the contact surface. After the printed circuit board provided with the solder deposit has been laid in the housing, the conductor is conducted into the housing with the connection end, with the result that the connection end is clamped between the solder deposit and the spring element. The solder deposit is subsequently melted by location-selective heating for direct soldering of the connection end to the contact surface.

The invention proceeds from the realization that, in principle, it would be expedient in the sense of the above problem to omit the conventionally used supply line between the conductor and the electronics and to bring the conductor into direct contact with the printed circuit board. However, the direct contact between the flat connection end and the printed circuit board causes a series of complications in the case of manufacture and assembly of the modular unit, with the result that the advantage connected to the omission of the supply line would be offset by disadvantages which are to be expected. Thus, it is generally recognized that, in particular, soldering of the flat (and hence with a comparatively large surface area) connection end to the printed circuit board is problematic. Although a soldering process such as this would still be comparatively simple to realize outside of the housing, the use of the printed circuit board connected to the conductor outside of the housing would complicate the assembly process. On the other hand, soldering the conductor inside the housing is particularly difficult to realize since the solder must be provided, the heat necessary for melting the solder must be supplied and the conductor must be held down on the corresponding contact surface of the printed circuit board, all under very tight space conditions. In this case, the following are to be taken into account as boundary conditions:

a) although the heat required for the soldering process must be supplied extensively across the entire contact surface, the supply of heat must be restricted, however, to the contact surface in order not to damage surrounding components (in particular the entire housing cannot generally be heated to the soldering temperature);

b) the heat required for the soldering process cannot be applied through the conductor without damaging same (provided the conductor is embodied in a not particularly temperature-resistant manner, which would lead to comparatively high manufacturing costs); and c) impurities on the contact surface of the printed circuit board, of the solder and of the conductor track of the conductor must be avoided during the soldering process.

In this connection, the invention makes it possible to be able to solder the conductor while meeting the above boundary conditions in the case of a printed circuit board which is already inserted into the housing. Owing to the fact that the connection end is held down by the spring element arranged in the housing, and hence no external pressing tool of a manufacturing machine must be introduced, space is gained for handling the soldering process. In particular, the spring element held locally in the housing can be configured to be significantly smaller and hence more space-saving than an external pressing tool.

Owing to the fact that, in the preferred manufacturing method, the contact surface is already provided with the solder deposit before the actual soldering process, the supply of solder during the soldering process becomes superfluous and, as a result, the manufacturing method is further simplified.

The invention also ensures a low cycle time in the manufacturing and hence reduced manufacturing costs.

In a preferred embodiment, the spring element is formed by a preloaded arm which projects from a housing wall. The spring arm is preferably oriented in the housing such that it runs precisely or at least approximately parallel to the printed circuit board. A stamp which holds down the connection end of the conductor is advantageously formed at the free end of the spring arm. The stamp is, in its longitudinal extent, oriented in particular precisely or at least approximately perpendicular to the printed circuit board and the contact surface formed thereon. Alternatively, however, the spring element within the scope of the invention may also be formed by a leaf spring which preferably also projects from a housing wall in a manner approximately parallel to the printed circuit board. In principle, within the scope of the invention, it is also conceivable that the spring element is formed by a spring pin or a spiral spring which is suitably arranged in the housing for exerting the pressing force. The spring pin or the spiral spring preferably protrudes in a manner approximately perpendicular to the printed circuit board from a housing wall lying opposite the printed circuit board.

In principle, within the scope of the invention, the spring element may be configured as a separate component from the housing, which component is inserted into the housing in the course of manufacturing the modular unit. However, within the sense of efficient manufacturing, the spring element is preferably integrally (monolithically) connected to the housing (in the case of a multi-part housing, to one of the housing parts) and is particularly preferably shaped together with the housing when the housing is manufactured, in particular in an injection-molding process.

In order to support a positionally accurate and hence functionally reliable joining of the conductor to the electronics, at least one alignment pin is arranged in the housing and penetrates a pair of tapered apertures in the printed circuit board and in the connection end of the conductor to position the connection end with respect to the printed circuit board. Preferably at least two, in particular precisely two, such alignment pins are provided.

In an embodiment which makes assembly particularly simple, the housing is assembled or can be assembled from a tub-shaped first housing part and at least one second housing part. In this connection, in particular, the second housing part forms a side wall of the tub shape defined by the first housing part or a part of such a side wall. Within the scope of the invention, the second housing part may also be placed on the tub-shaped first housing part in the form of a cover, however.

In the case of the two-part housing described above, the electronics are inserted into the first housing part. The spring element projects from the second housing part such that the spring element exerts the pressing force on the connection end of the conductor when the housing is assembled. In this case, the spring element is only brought into its correct position with respect to the solder point when the housing is assembled (and, in particular, after the conductor has been inserted), as a result of which the manufacture of the modular unit is designed to be particularly simple.

Preferably, the second housing part is held on the first housing part in a force-fitting and/or form-fitting manner.

In the case of a two-part housing, provision is preferably made for the conductor to be guided out of the housing between an edge of the first housing part and an edge of the second housing part in a positionally fixed manner. This allows strain relief for the conductor, as a result of which the solder connection is advantageously subjected to a particularly low mechanical loading.

In this case, in a preferred embodiment, the first housing part is provided with a cutout through which the conductor is guided out of the housing. The cutout is in particular formed as an indentation (notch) in an outer edge of the first housing part. The second housing part is formed by a wall insert which is inserted or insertable into the cutout and, in an expedient embodiment, is slid or can be slid into the cutout, for example using a tongue-and-groove connection.

In an embodiment which is particularly advantageous in terms of its functional reliability, the housing is over molded in its assembled state with a molding compound, with the result that the evaluation unit and the connection end are covered by the molding compound and, as a result, particularly well protected against environmental influences.

In a preferred usage, the modular unit according to the invention is a capacitive proximity sensor which is used as a device for touch-free actuation of a displaceable part of a vehicle, in particular for touch-free opening and/or closing of a tailgate, of a (motor) vehicle. Alternatively, the vehicle part to be displaced may also be another vehicle door, for example a sliding side door or an engine compartment cover. Furthermore, the modular unit may also, within the scope of the invention, be used to actuate a vehicle window, a sunroof, a folding top or a displaceable part in the vehicle interior.

In the course of the method according to the invention, the heat required to melt the solder deposit is preferably supplied from an underside of the printed circuit board which faces away from the contact surface. The printed circuit board is therefore heated on the underside which faces away from the contact surface. As a result of this, the thermal loading of the conductor can be kept particularly low, which enables the use of a comparatively less temperature-resistant and hence more cost-effective carrier material and/or insulating material for the conductor. In this connection, the heat is preferably supplied by a hot soldering tool (soldering tip, soldering iron, soldering wire, etc.) making mechanical contact with the printed circuit board. Alternatively, the printed circuit board and/or the solder deposit are heated by a contactless method (in particular laser irradiation or induction). In order to enable the introduction of the soldering tool or the laser beam in the case of the printed circuit board inserted into the housing, the housing is preferably provided with a suitably positioned access opening.

Other features which are considered as characteristic for the invention are set forth in the appended claims.

Although the invention is illustrated and described herein as embodied in an electronic modular unit, in particular capacitive proximity sensor for a vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Mutually corresponding parts are always provided with identical reference signs in all of the figures. Referring now to the figures of the drawings in detail and first, particularly to FIG. 1 thereof, there is shown a capacitive (proximity) sensor 1 for a motor vehicle. The sensor 1 is used in a tailgate, for example, for touch-free opening.

Figure 1:
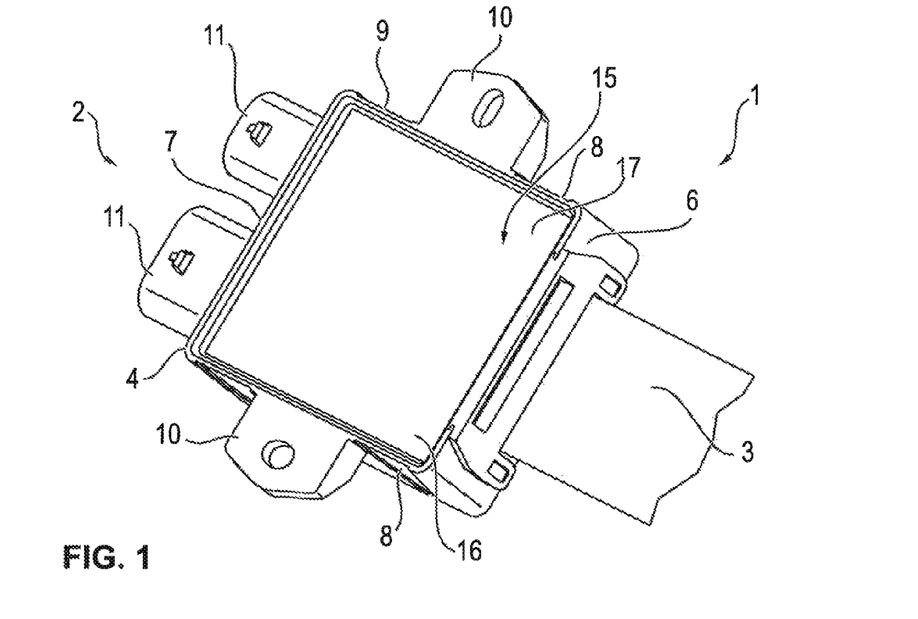
FIG. 1 is a diagrammatic, perspective view of a top of a capacitive proximity sensor with a control unit containing electronics and a flat-conductor electrode connected thereto, wherein a connection end of the flat-conductor electrode is guided into a housing of the control unit in order to make contact with the electronics and wherein the electronics and the connection end brought into contact therewith are over molded with a molding compound.

The sensor 1 contains a control unit 2 and a flat-conductor electrode 3 connected thereto. The flat-conductor electrode 3 is formed by a copper foil acting as electrical conductor, which is coated on all sides (and thus, in particular, on the two flat sides) with a plastic layer acting as insulating and carrier material.

The control unit 2 contains a housing 4 composed of plastic. The housing 4, which is constructed in a tub-like manner, is formed from a housing base 5 (FIG. 2) and four walls projecting approximately at right angles from the housing base. That housing side at which the flat-conductor electrode 3 is inserted into the housing 4 is referred to below as front side. The wall of the housing 4 arranged at the front side is referred to as (front) wall 6. The wall of the housing 4 lying opposite the front wall is referred to as (rear) wall 7. The two remaining, mutually opposing walls of the housing 4 which each connect the front wall 6 to the rear wall 7 are referred to as (side) walls 8.

The housing base 5 is arranged at an underside of the housing 4. The walls 6, 7, 8 each adjoin the housing base 5 with a lower edge. The upper edges of the walls 6, 7, 8 extend as far as a surrounding upper outer edge 9 of the housing 4 in a plane. The housing 4 is preferably open toward the upper side facing away from the housing base 5. However, a cover may also be placed on the outer edge 9 in an alternative configuration (not illustrated).

A bracket 10 projects from each of the side walls 8, in which a bushing for indirectly or directly screwing the housing 4 or the control unit 2 to a vehicle is introduced. The brackets 10 are arranged flush with the outer edge 9.

Two female connectors 11 of an electrical plug-in connector are arranged on the rear wall 7. One of the female connectors 11 (on the left in the illustration) is used here to connect a signal and supply line for the control unit 2. The second female connector 11 (on the right in the illustration) is used to connect a circular-conductor electrode (not illustrated) for the sensor 1.

According to FIG. 1, a housing interior 15 enclosed by the housing 4 is filled with a molding compound 16, for example an epoxy resin. The molding compound 16 abuts each of the walls 6, 7, 8 and finishes with a flat top surface 17 just under the outer edge 9 of the housing 4. The molding compound 16 is used to protect electronics 20 (FIG. 3) arranged in the housing interior 15 and a connection end 21 (FIG. 3) of the flat-conductor electrode 3 (FIG. 3) inserted into the housing 4, by the molding compound sealing the housing interior 15 and the components arranged therein in a manner electrically insulated from the exterior as well as air- and watertight.

Figure 2:
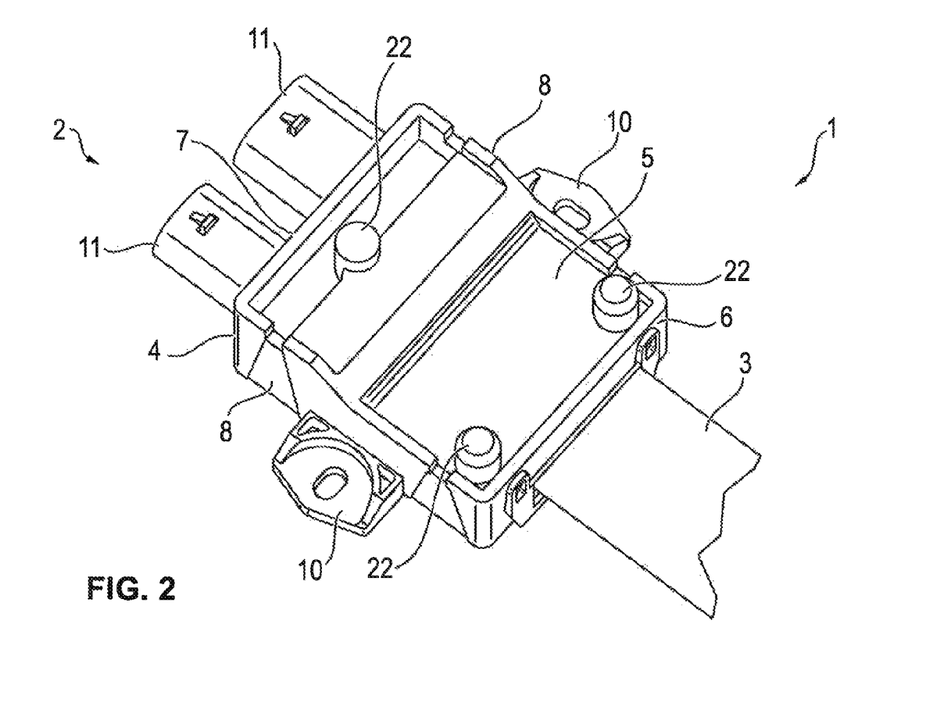
FIG. 2 is a perspective, bottom view of the proximity sensor according to FIG. 1.

As can be seen in particular from FIG. 2, the housing base 5 has a rectangular outline. However, the housing base 5 is embodied in a manner profiled (in particular, stepped) along its flat extent. Furthermore, three downwardly projecting projections 22 are formed on the outside of the housing base 5 and act, in particular, as screw bosses and to which the electronics 20 are screwed in the mounted state with the housing base 5. In an alternative embodiment, the printed circuit board 25 is not screwed to the housing 4 but only attached thereto via press-fit contacts and the molding compound 16. The apertures in the printed circuit board 25 which correspond to the projections 22 are used in this case merely for the purpose of positioning when inserting the printed circuit board 25 into the housing 4.

Figure 3:
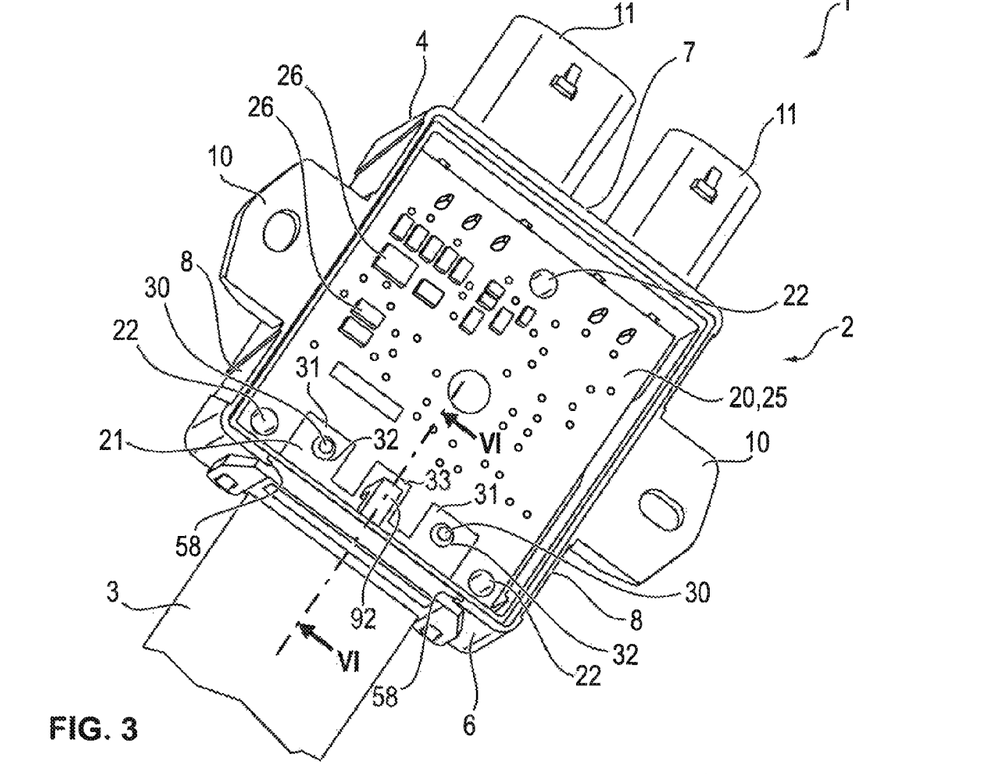
FIG. 3 is a perspective view which is rotated with respect to FIG. 1 with a view of the top of the proximity sensor in that figure in a non-over molded state.

FIG. 3 shows the sensor 1 in the non-overmolded state in a view direction toward the top. It can be seen in this illustration that the electronics 20 are formed by a printed circuit board 25, which is populated with electronic components 26 (in particular, a microcontroller) which are not explained in any more detail here. The printed circuit board 25 is plane parallel to the outer edge 9 in the housing 4, wherein it extends almost as far as the walls 6, 7, 8. The printed circuit board 25 is positioned and fixed by the projections 22 and two alignment pins 30 formed on the inside on the housing base 5.

The connection end 21 of the flat-conductor electrode 3 is electrically connected and mechanically attached to a front-side edge of the printed circuit board 25. The flat connection end 21 of the flat-conductor electrode 3 lies flat on a flat, upwardly facing side of the printed circuit board 25.

At the connection end 21, the flat-conductor electrode 3 is subdivided in the transverse direction into three sections 31 delimited from one another by slots. In the region of the two edge-side sections 31, in each case a hole 32 is introduced into the flat-conductor electrode 3, by which the flat-conductor electrode 3 is placed on the respectively assigned alignment pin 30. For this purpose, the holes 32 are preferably manufactured to be undersized with respect to the corresponding alignment pins 30, with the result that the flat-conductor electrode 3 is positioned and fixed in position in a force-fitting manner on the alignment pins 30 both with respect to the housing 4 and with respect to the printed circuit board 25.

In the illustrated exemplary embodiment, the flat-conductor electrode 3 (or the conductor track thereof) is soldered in the region of the central section 31 to a corresponding conductor track on the printed circuit board 25. The central section 31 is therefore also referred to as contact section 33.

The contact section 33 is mechanically decoupled to a certain extent from the edge-side sections 31—primarily used for mechanically holding the flat-conductor electrode 3—by the slots between the sections 31. The contact section 33 and the solder point connecting the former to the printed circuit board 25 are relieved of strain as a result.

Figure 4:
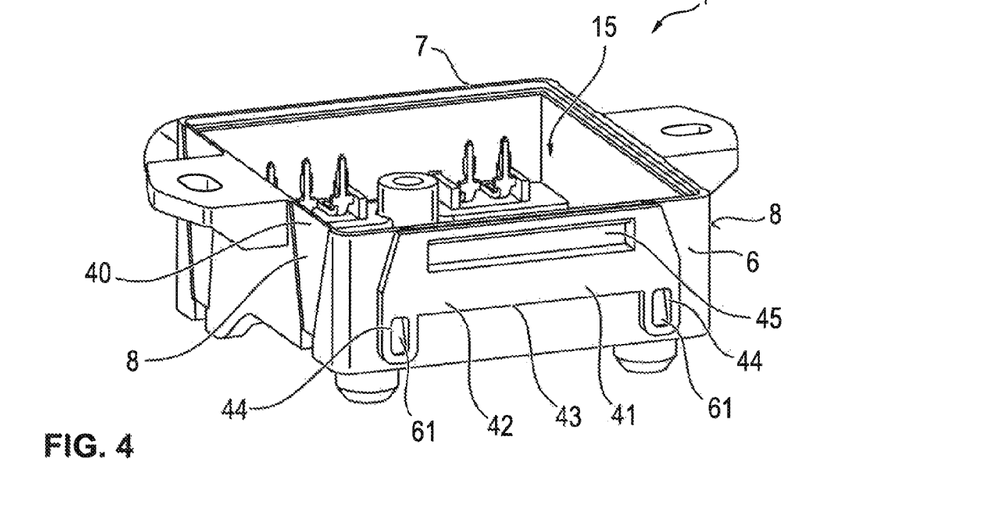
FIG. 4 is a perspective view of the housing of the control unit formed by a tub-like first housing part and a second housing part embodied as a wall insert.

FIG. 4 shows the empty housing 4 with a view into the housing interior 15 delimited by the housing base 5 and the walls 6, 7, 8. It can be seen from this illustration that the housing 4 is formed from two parts, namely a first housing part 40 and a second housing part arranged on the front side. The second housing part includes a part of the front wall 6 and is therefore referred to below as wall insert 41.

A surface 42, arranged on the outside of the housing, of the wall insert 41 has a substantially trapezoid shape. An eyelet 44 is formed in each case on both sides at the lower edge 43 of the surface 42. A longitudinal recessed grip 45 is formed in the wall insert 41 close to the upper edge of the surface 42.

Figure 5:
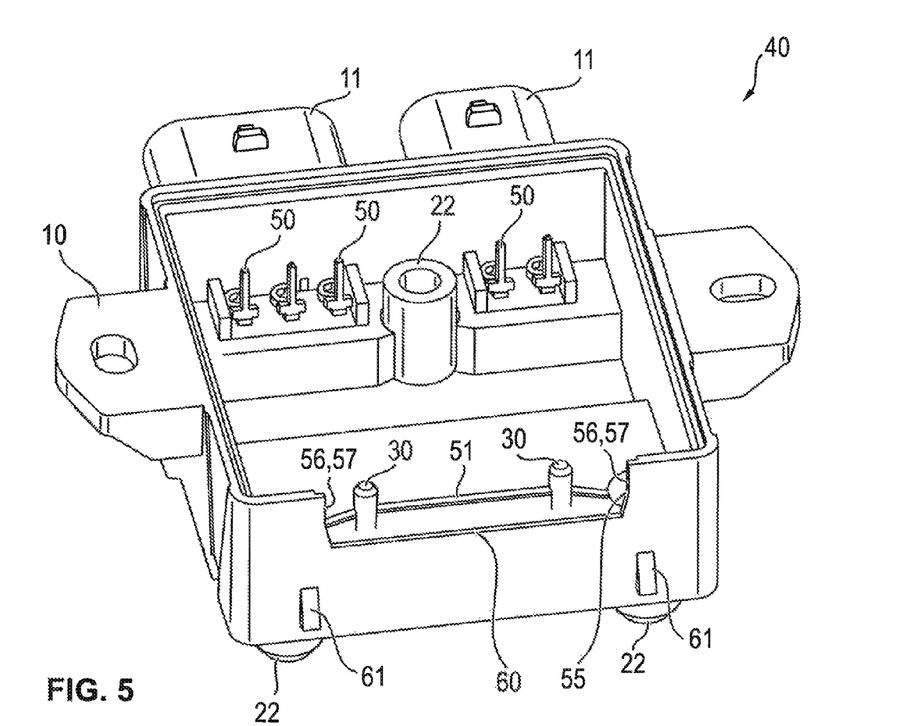
FIG. 5 is a perspective view of the first housing part of the housing.

The first housing part 40 is shown in a detail illustration in FIG. 5. It can be seen from the illustration that a number of contact elements 50 (press-fit contact elements) project from the housing base 5 in the housing interior 15 in the rearward area of the housing part 40, are assigned to the female connectors 11 and penetrate corresponding contact openings in the printed circuit board 25 (see FIG. 3) in the installation state of the electronics 20. The two alignment pins 30 project from the housing base 5 in the housing interior 15 close to the front wall 6, the alignment pins serving—as can be seen in FIG. 3—as positioning means for the flat-conductor electrode 3 and the printed circuit board 25. Furthermore, a reinforcing web 51, which likewise projects from the housing base 5, for the printed circuit board 25 can be seen.

The first housing part 40 forms the housing base 5, the walls 7 and 8 and an edge-side part of the front wall 6. An approximately rectangular cutout 55 is introduced into the front wall 6 from the outer edge 9 and is used as bushing for the flat-conductor electrode 3 from the housing 4. In the final assembled state of the control unit 2, the cutout 55 is filled in by the wall insert 41.

In order to fasten the wall insert 41 to the housing part 40, a web 57 is in each case formed along the two opposing side edges 56 of the cutout 55. The webs 57 interact here with an assigned groove 58 (FIG. 3) of the wall insert 41 to form a tongue-and-groove connection. By means of the tongue-and-groove connection, the wall insert 41 can be slid into the cutout 55. The lower edge 60 of the cutout 55 is embodied without a web.

Two latching lugs 61 are formed on the housing part 40 at the lower end of the front wall 6. The latching lugs 61 interact with the eyelets 44 of the wall insert 41 to form a latched connection and are thus used to latch the wall insert 41 into the cutout 55 (FIG. 4).

In an exemplary embodiment, the cutout 55 extends over approximately 40% of the height of the front wall 6 and over approximately 65% of the width of the front wall 6. The width of the cutout corresponds approximately in this case to the width of the flat-conductor electrode 3. The lower edge 60 of the cutout 55 is approximately at the height of the correctly inserted printed circuit board 25.

It can be seen when looking at FIG. 1 and FIG. 3 that the molding compound 16, which is poured in a liquid state during the manufacturing process of the modular unit 1, would flow out of the housing 4 through the cutout 55 were it not for the wall insert 41. The wall insert 41 is therefore used as a barrier for the molding compound 16.

Figure 6:
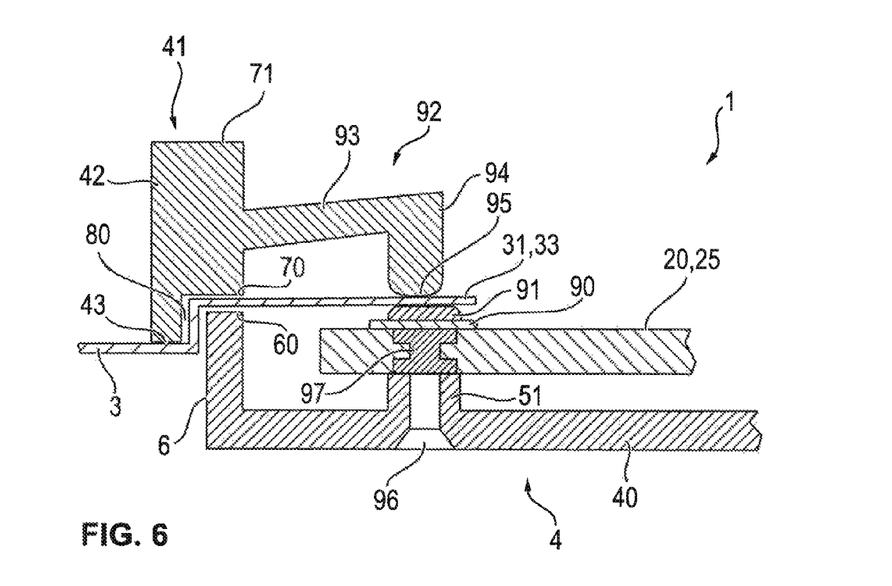
FIG. 6 is a simplified section view taken along the line VI-VI shown in FIG. 3 through the proximity sensor in a pre-assembly state.

FIG. 6 shows a section (not illustrated to scale) of the modular unit 1 taken along the line VI-VI shown in FIG. 3. It can be seen here that the flat-conductor electrode 3 is inserted into the housing 4 between the lower edge 60 of the cutout 55 and an inside lower edge 70 of the wall insert 41. It can also be seen that the wall insert 41 has a wall thickness which is greater than the wall thickness of the surrounding front wall 6. The wall insert 41 is divided into a ledge 71, which is embodied in a substantially complementary manner to the cutout 55, and the surface 42, which is formed on the ledge 71 on the housing exterior. In particular, the ledge 71 has approximately the thickness of the surrounding region of the housing part 40 and finishes flush with the surrounding wall 6 in the interior. The surface 42 projects in its flat extent both laterally and downwardly over the cutout 55 (see also FIG. 4).

As a result of this, a stepped (L-shaped in cross section) gap 80 is formed at the lower edge 60 of the cutout 55 between the wall insert 41 and the housing part 40, through which gap the flat-conductor electrode 3 is guided, with the result that the flat-conductor electrode 3 is clamped between the wall insert 41 and the housing part 40. The housing bushing described therefore provides the flat-conductor electrode 3 with effective strain relief.

Furthermore, the wall insert 41 supports the soldering process for electrical connection of the flat-conductor electrode 3 to the electronics 20.

In order to explain the soldering process, the modular unit 1 is shown in a pre-assembled state in FIG. 6. In this pre-assembled state, the printed circuit board 25—which was previously populated with the electronic components 26 outside of the housing 4—has already been inserted into the housing part 40 and fixed there. Furthermore, the flat-conductor electrode 3 with the connection end 21 has been guided into the housing 4 and fixed to the housing part 40 by latching of the wall insert 41. In the pre-assembled state according to FIG. 6, the flat-conductor electrode 3 has not yet been soldered to the printed circuit board 25, however.

As can be seen in FIG. 6, an electrically conductive contact surface 90 is applied on the printed circuit board 25, the area of which contact surface corresponds approximately to the contact section 33 of the flat-conductor electrode 3. The flat-conductor electrode 3 is laid in the housing 4 such that the contact section 33 aligns with the contact surface 90. In this connection, in order to solder the contact section 33, a solder deposit 91 has been applied to the contact surface 90 during the population of the printed circuit board 25.

In order to fix the contact section 33, a spring element (referred to below as hold-down element 92) is formed in one piece on the inside of the wall insert 41 (see also FIG. 3). According to FIG. 6, the hold-down element 92 is formed by a preloaded arm 93 projecting from the wall insert 41, on which arm a stamp 94 which projects downward from the arm 93 is formed. A free end 95 of the stamp 94 abuts the assigned contact section 33 and pushes same against the contact surface 90 and the solder deposit 91 applied thereto.

For the soldering process, the solder deposit 91 is now melted by location-selective heat supply, with the result that when the solder resolidifies, a permanent electrical connection between the flat-conductor electrode 3 and the contact surface 90 of the printed circuit board 25 has been produced.

In a variant of the method, the heat required for the soldering process is supplied by a hot soldering tool (soldering tip) which is placed on an underside of the printed circuit board 25 in alignment with the contact surface 90. Alternatively, the solder deposit 91 is heated using induction. In both cases, the heat is applied to the side of the printed circuit board 25 which faces away from the contact surface 90. The contact section 33 is fixed relative to the contact surface 90 by the hold-down element 92 during the soldering process. External means for fixing the contact section 33 are therefore advantageously neither necessary nor provided.

In order to be able to introduce the soldering tool from below to the printed circuit board 25 installed in the housing 4, the housing base 5 is provided with an access opening 96 in the region of the reinforcing web 51. In order to conduct in a targeted manner the heat supplied from below inside the printed circuit board 25 to the contact surface 90 and the solder deposit 91 applied thereto, a metal insert 97, which acts as a heat-conducting bridge, is preferably let into the printed circuit board 25 in alignment with the contact surface 90.

After the manufacture of the solder connection, the (assembled) housing 4 is filled with the liquid molding compound 16, which then solidifies and thus hermetically seals the housing 4. The access opening 96 is also sealed with molding compound in the same molding step or subsequently.

The subject matter of the invention is not restricted to the exemplary embodiment described above. Instead, further embodiments of the invention can be derived from the above description by a person skilled in the art. In particular, the described individual features of the invention and the variant configurations thereof may also be combined with one another in a different way.

The following is a summary list of reference numerals and the corresponding structure used in the above description of the invention. List of reference signs:
1 (proximity) sensor
2 control unit
3 flat-conductor electrode
4 housing
5 housing base
6 (front) wall
7 (rear) wall
8 (side) wall
9 outer edge
10 bracket
11 female connector
15 housing interior
16 molding compound
17 top surface
20 electronics
21 electronics
22 projection
25 printed circuit board
26 electronic component
30 alignment pin
31 section
32 hole
33 contact section
40 housing part
41 wall insert
42 surface
43 edge
44 eyelet
45 recessed grip
50 contact element
51 reinforcing web
55 cutout
56 side edge
57 web
58 groove
60 edge
61 latching lug
70 edge
71 ledge
80 gap
90 contact surface
91 solder deposit
92 hold-down element
93 arm
94 stamp
95 free end
96 access opening
97 metal insert

The invention claimed is:

1. An electronic modular unit, comprising:
electronics having a printed circuit board with a contact surface;
a housing receiving said electronics;
an electrical conductor having a flat connection end directly soldered to said contact surface of said printed circuit board; and
a spring element disposed in said housing and pressing said flat connection end of said electrical conductor on said contact surface of said printed circuit board for fixing said flat connection end during soldering.

2. The electronic modular unit according to claim 1, wherein:
said housing has a housing wall; and
said spring element has a spring arm projecting from said housing wall.

3. The electronic modular unit according to claim 2, wherein said spring arm is oriented precisely or approximately parallel to said printed circuit board and has a free end, said spring element having a stamp, which is oriented precisely or at least approximately perpendicular to said printed circuit board, is formed on said free end of said spring arm.

4. The electronic modular unit according to claim 1, wherein said spring element is integrally connected to said housing.

5. The electronic modular unit according to claim 1,
   wherein said printed circuit board has a pair of tapered apertures formed therein; and
   further comprising at least one alignment pin disposed in said housing and penetrating said pair of tapered apertures in said printed circuit board and in said flat connection end to position said flat connection end with respect to said printed circuit board.

6. The electronic modular unit according to claim 1, wherein:
   said housing has a first housing part and at least one second housing part;
   said electronics are enclosed in said first housing part; and
   said spring element projects from said second housing part such that said spring element is pressed against said flat connection end.

7. The electronic modular unit according to claim 6, wherein said electrical conductor is guided out of said housing between an edge of said first housing part and an edge of said second housing part in a positionally fixed manner.

8. The electronic modular unit according to claim 1, wherein the electronic modular unit is a capacitive proximity sensor for a vehicle.

9. A method for producing a modular unit, which comprises the steps of:
   providing a printed circuit board with a solder deposit in a region of a contact surface;
   inserting the printed circuit board with the solder deposit into a housing;
   inserting a conductor having a connection end into the housing, with a result that the connection end is clamped between the solder deposit and a spring element; and
   melting the solder deposit by location-selective heating for direct soldering of the connection end to the contact surface.

10. The method according to claim 9, which further comprises heating the printed circuit board from an underside of the printed circuit board which faces away from the contact surface in order to melt the solder deposit.

\* \* \* \* \*